US012769198B2

(12) United States Patent
Wu et al.

(10) Patent No.: US 12,769,198 B2
(45) Date of Patent: Oct. 20, 2026

(54) METHODS AND APPARATUS FOR RUTHENIUM OXIDE REDUCTION ON EXTREME ULTRAVIOLET PHOTOMASKS

(71) Applicant: APPLIED MATERIALS, INC., Santa Clara, CA (US)

(72) Inventors: Banqiu Wu, San Jose, CA (US); Khalid Makhamreh, Los Gatos, CA (US); Eliyahu Shlomo Dagan, Sunnyvale, CA (US)

(73) Assignee: APPLIED MATERALS, INC.

( * ) Notice: Subject to any disclaimer, the term of this patent is extended or adjusted under 35 U.S.C. 154(b) by 583 days.

(21) Appl. No.: 18/276,760

(22) PCT Filed: Feb. 8, 2022

(86) PCT No.: PCT/US2022/015554

§ 371 (c)(1),
(2) Date: Aug. 10, 2023

(87) PCT Pub. No.: WO2022/182510

PCT Pub. Date: Sep. 1, 2022

(65) Prior Publication Data

US 2024/0118603 A1 Apr. 11, 2024

Related U.S. Application Data

(60) Provisional application No. 63/153,753, filed on Feb. 25, 2021.

(51) Int. Cl.
*G03F 1/24* (2012.01)
*G03F 1/74* (2012.01)

(52) U.S. Cl.
CPC . *G03F 1/24* (2013.01); *G03F 1/74* (2013.01)

(58) Field of Classification Search
CPC ..... G03F 1/24; G03F 1/74; G03F 1/48; G03F 1/82; H01J 37/32357; H01J 37/32724; H01J 37/32825
(Continued)

(56) References Cited

U.S. PATENT DOCUMENTS

| | | | |
|---|---|---|---|
| 10,372,029 | B2 | 8/2019 | Imoto et al. |
| 2004/0219789 | A1 | 11/2004 | Wood et al. |

(Continued)

FOREIGN PATENT DOCUMENTS

| | | | |
|---|---|---|---|
| KR | 101163221 | B1 | 7/2012 |

OTHER PUBLICATIONS

Wasielewski et al., Surface Chemistry of Ru: Relevance to Optics Lifetime in EUVL, SPIE, vol. 6533, No. 1, 16, Dec. 31, 2007 (Dec. 31, 2007), pp. 1-12, XP040239055.

(Continued)

*Primary Examiner* — Caleen O Sullivan
(74) *Attorney, Agent, or Firm* — Moser Taboada

(57) ABSTRACT

Methods and apparatus for reducing ruthenium oxide on an extreme ultraviolet (EUV) photomask leverage temperature, plasma, and chamber pressure to increase the reduction. In some embodiments, a method includes heating the EUV photomask with a ruthenium (Ru) capping layer with a top surface which has a Ru oxide layer to a temperature of approximately 100 degrees Celsius to approximately a thermal budget of the EUV photomask, flowing a reducing agent gas into an EUV photomask processing chamber, and pressurizing the EUV photomask processing chamber to a process pressure to increase a reducing reaction between the reducing agent gas and a Ru oxide layer on the Ru capping layer. Other embodiments may incorporate remote plasma generators or atmospheric-pressure plasma generators to enhance the reduction of Ru oxides on the Ru capping layer.

25 Claims, 4 Drawing Sheets

(58) Field of Classification Search
USPC .............................................................. 430/5
See application file for complete search history.

(56) References Cited

U.S. PATENT DOCUMENTS

| | | | |
|---|---|---|---|
| 2006/0160034 | A1 | 7/2006 | Wurm et al. |
| 2015/0376792 | A1 | 12/2015 | Spurlin et al. |
| 2016/0011344 | A1 | 1/2016 | Beasley et al. |
| 2017/0017146 | A1 | 1/2017 | Leonhard |
| 2017/0017151 | A1 | 1/2017 | Matsushima et al. |
| 2021/0010160 | A1 | 1/2021 | Olsen et al. |
| 2021/0012043 | A1 | 1/2021 | Sato et al. |
| 2022/0107557 | A1 | 4/2022 | Ikebe |

OTHER PUBLICATIONS

Bajt et al., Properties of Ultrathin Films Appropriate for Optics Capping Layers Exposed to High Energy Photo Irradiation, Surface Science Reports, vol. 63, No. 2, Dec. 20, 2007 (Dec. 20, 2007), pp. 73-99, XP022424476.

European Search Report, for EP 22760197, dated Apr. 22, 2025.

International Search Report and Written Opinion for PCT/US2022/015554, dated May 30, 2022.

Ugur, D. et al., Kinetics of Reduction of a RuO2 (110) Film on Ru (0001) by H2. The Journal of Physical Chemistry C, Nov. 26, 2012, vol. 116, No. 51,pp. 26822-26828, (abstract only).

METHODS AND APPARATUS FOR RUTHENIUM OXIDE REDUCTION ON EXTREME ULTRAVIOLET PHOTOMASKS

FIELD

Embodiments of the present principles generally relate to semiconductor manufacturing.

BACKGROUND

In order to reduce the size of electronic devices, extreme ultraviolet (EUV) lithography is sometimes used in the semiconductor industry. The main drawback of EUV technologies is the large expense of the exposure tools and consumables such as EUV photomasks. EUV includes very short wavelengths that are absorbed more strongly than longer wavelengths. The EUV lithography uses photomasks that function by reflecting light with multiple alternating layers of molybdenum and silicon. In typical configurations, the EUV photomask may use 40 or more alternating layers which reflect the EUV light through Bragg diffraction. To protect the multiple alternating layers, a thin capping layer of ruthenium is formed over the top. During use, the photoresists become heated by absorption of the EUV light which can cause outgassing of hydrocarbons, water, and oxygen. The inventors have observed that the ruthenium capping layer of the EUV photomask becomes oxidized with lithographic use and during photomask fabrication processes, reducing the reflectivity of the photomask.

Accordingly, the inventors have provided methods and apparatus for reduction of oxides that form on the ruthenium capping layer of the EUV photomask, extending the performance and life of the photomask.

SUMMARY

Methods and apparatus for reducing oxide formation on ruthenium capping layers of EUV photomasks.

In some embodiments, a method for reducing ruthenium oxides on an extreme ultraviolet (EUV) photomask may comprise heating the EUV photomask with a ruthenium (Ru) capping layer with a top surface which has a Ru oxide layer to a temperature of approximately 100 degrees Celsius to approximately a thermal budget of the EUV photomask, flowing a reducing agent gas into an EUV photomask processing chamber, and pressurizing the EUV photomask processing chamber to a process pressure to increase a reducing reaction between the reducing agent gas and the Ru oxide layer on the Ru capping layer.

In some embodiments, the method may further include wherein the process pressure is from zero to approximately 150 psi, wherein the process pressure is from zero to approximately 1500 psi, wherein the EUV photomask processing chamber is a cylindrical chamber and the process pressure is from zero to approximately 2500 psi, wherein the process pressure is obtained by regulating a flow of the reducing agent gas into the EUV photomask processing chamber and effluent gases out of the EUV photomask processing chamber, wherein the reducing agent gas is carbon monoxide gas, methane gas, or hydrogen gas, flowing a carrier gas along with the reducing agent gas, wherein the carrier gas reduces volatility of high concentrations of explosive reducing agent gases, and/or wherein the thermal budget of the EUV photomask is approximately 150 degrees Celsius.

In some embodiments, a method for reducing ruthenium oxides on an EUV photomask may comprise flowing a reducing agent gas and a carrier gas into a remote plasma generator, generating a plasma in the remote plasma generator using an RF power source, and flowing gases from the remote plasma generator into an EUV photomask processing chamber, wherein a remote plasma is formed above the EUV photomask to generate a self-bias on the EUV photomask and wherein the gases in the EUV photomask processing chamber react with a ruthenium oxide layer on a Ru capping layer to reduce the Ru oxide layer to Ru metal.

In some embodiments, the method may further include wherein EUV photomask processing chamber operates in a vacuum, wherein the plasma in the remote plasma generator is inductively coupled plasma, wherein the reducing agent gas is carbon monoxide gas or methane gas and the carrier gas is argon gas, helium gas, or nitrogen gas, wherein the RF power source operates at a frequency of 13.56 MHz, wherein the reducing agent gas is hydrogen gas and the remote plasma is adjusted to a sustainable level while providing a self-biasing power level of approximately 5 eV such that implantation of atomic hydrogen into the Ru capping layer is prevented, heating the EUV photomask to a temperature of approximately 100 degrees Celsius to approximately a thermal budget of the EUV photomask, and/or wherein the thermal budget of the EUV photomask is approximately 150 degrees Celsius.

In some embodiments, a method for reducing ruthenium oxides on an EUV photomask may comprise flowing a reducing agent gas and a carrier gas into an atmospheric-pressure (AP) plasma generator in an EUV photomask processing chamber, generating a plasma above the EUV photomask with the AP plasma generator using an RF power source, and flowing the reducing agent gas and the carrier gas into the plasma and onto a top surface of the EUV photomask, wherein the reducing agent gas reacts with a ruthenium (Ru) oxide layer on a Ru capping layer to reduce the Ru oxide layer to Ru metal.

In some embodiments, the method may further include heating the EUV photomask to a temperature of approximately 100 degrees Celsius to approximately a thermal budget of the EUV photomask, wherein the thermal budget of the EUV photomask is approximately 150 degrees Celsius, wherein the plasma in the AP plasma generator is dielectric barrier discharge plasma, wherein the reducing agent gas is carbon monoxide gas, methane gas, or hydrogen gas and the carrier gas is argon gas, helium gas, or nitrogen gas, and/or wherein the RF power source operates at a frequency of 13.56 MHz.

In some embodiments, an apparatus for reducing ruthenium oxides on an EUV photomask may comprise an EUV photomask processing chamber with a photomask support body attached to a photomask support, the photomask support body supporting an EUV photomask when present, a reducing agent gas supply fluidly connected to the EUV photomask processing chamber, a heater electrode in the photomask support body that is configured to heat the EUV photomask when present to a range of approximately 100 degrees to approximately 150 degrees, a first valve that controls a reducing agent gas that enters into the EUV photomask processing chamber, a second valve that controls effluent gases that exit the EUV photomask processing chamber, and a controller that regulates the first valve and the second valve to adjust a pressure inside of the EUV photomask processing chamber, wherein the pressure is adjustable from zero psi to 2500 psi and is adjusted, by the controller, to control a reduction rate to reduce RU oxides on a RU capping layer on the EUV photomask.

In some embodiments, an apparatus for reducing ruthenium oxides on an EUV photomask may comprise an EUV photomask processing chamber with a photomask support body attached to a photomask support, the photomask support body supporting an EUV photomask when present, a reducing agent gas supply fluidly connected to the EUV photomask processing chamber, a carrier gas supply fluidly connected to the EUV photomask processing chamber, and a remote plasma generator fluidly connected to the EUV photomask processing chamber, wherein the remote plasma generator is configured to allow a reducing agent gas from the reducing agent gas supply and a carrier gas from the carrier gas supply flow through the remote plasma generator when plasma is generated in the remote plasma generator and subsequently allow the reducing agent gas, the carrier gas, and the plasma to flow into the EUV photomask processing chamber to interact with the EUV photomask when present to reduce RU oxides on a RU capping layer on the EUV photomask.

In some embodiments, the apparatus may further include a heater electrode in the photomask support body that is configured to heat the EUV photomask when present to a range of approximately 100 degrees to approximately 150 degrees to enhance a reduction rate of Ru oxides, a controller that regulates a reduction rate of the Ru oxides by regulating a power applied to the plasma in the remote plasma generator or by regulating a temperature of the EUV photomask when present by adjusting power to the heater electrode.

In some embodiments, an apparatus for reducing ruthenium oxides on an EUV photomask may comprise an EUV photomask processing chamber with a photomask support body attached to a photomask support, the photomask support body supporting an EUV photomask when present, a reducing agent gas supply fluidly connected to the EUV photomask processing chamber, a carrier gas supply fluidly connected to the EUV photomask processing chamber, and an atmospheric-pressure (AP) plasma generator in the EUV photomask processing chamber, wherein the AP plasma generator is configured to allow a reducing agent gas from the reducing agent gas supply and a carrier gas from the carrier gas supply to flow through the AP plasma generator when dielectric barrier discharge plasma is generated by the AP plasma generator directly above the EUV photomask and subsequently allow the reducing agent gas and the carrier gas to flow onto a top surface of the EUV photomask to reduce RU oxides on a RU capping layer on the EUV photomask.

In some embodiments, the apparatus may further include a heater electrode in the photomask support body that is configured to heat the EUV photomask when present to a range of approximately 100 degrees to approximately 150 degrees to enhance a reduction rate of Ru oxides and/or a controller that regulates a reduction rate of the Ru oxides by adjusting a power applied to the dielectric barrier discharge plasma in the AP plasma generator or by adjusting a temperature of the EUV photomask when present by adjusting power to the heater electrode.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
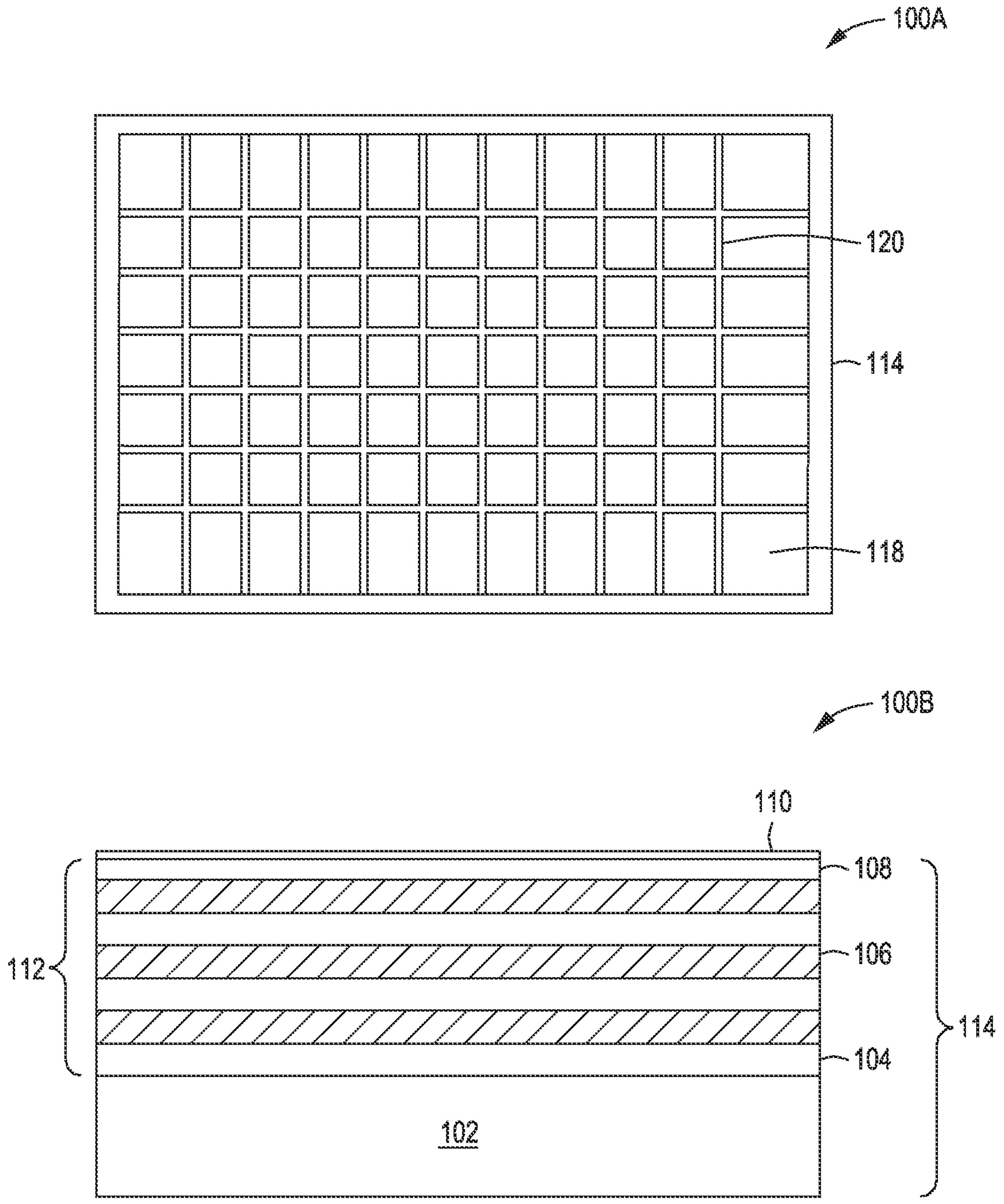
FIG. 1 depicts a top-down and cross-sectional view of an EUV photomask in accordance with some embodiments of the present principles.

To facilitate understanding, identical reference numerals have been used, where possible, to designate identical elements that are common to the figures. The FIGURES are not drawn to scale and may be simplified for clarity. Elements and features of one embodiment may be beneficially incorporated in other embodiments without further recitation.

DETAILED DESCRIPTION

The methods and apparatus enable prolonged life and performance of extreme ultraviolet (EUV) photomasks used in EUV lithography. The reduction of oxides on the ruthenium (Ru) capping layer of the EUV photomask increases the reflectivity of the photomask and decreases the resistivity of the Ru capping layer, stabilizing performance and prolonging the life of the EUV photomask. The ruthenium oxide may be formed due to outgassing of water and oxygen from photoresist materials that are heated during EUV absorption in an exposure tool, or during EUV photomask fabrication. The EUV photomask is very expensive and the ruthenium capping layer may be easily damaged during use, so extending the life of the photomask may dramatically reduce the overall cost of EUV related production. The reduction of Ru oxide to Ru metal is difficult on EUV photomasks because the reduction reaction requires high temperatures to overcome the activation energy. However, the EUV photomasks have a thermal budget of approximately 150 degrees Celsius. The inventors have found that Ru oxide reduction by hydrogen is spontaneous at room temperature and above, but kinetically, using hydrogen is too slow to make hydrogen's use practical and, in some cases, the hydrogen may damage the Ru capping layer. The inventors have found several techniques to provide the necessary kinetic energy through the use of specific reducing agent gases, pressures, and temperatures to enable Ru oxide reduction on EUV photomasks while maintaining the photomask thermal budget and while being efficient enough timewise to permit use in commercial environments.

In a top-down view 100A of FIG. 1, a representation of an EUV photomask 114 is depicted. As a simplified example, and not meant to be limiting, the EUV photomask 114 has a crosshatch pattern 120 of square/rectangles 118 that is to be exposed by EUV light in an EUV exposure tool (not shown). In a view 100B, a cross-section of a portion of the EUV photomask 114 is depicted. A substrate 102, for example, has alternating silicon layers 104 and molybdenum layers 106 deposited on the substrate 102 to form a Bragg reflector 112. The silicon layers 104 function as spacer layers and the molybdenum layers 106 function as absorber layers. Other materials besides molybdenum may be used as well. A Ru capping layer 108 is used to protect the Bragg reflector 112 as the molybdenum may be easily oxidized. The Ru capping layer 108 may be from approximately 2 nm to 3 nm in thickness. In the example in FIG. 1, a Ru oxide layer 110 has formed on the top surface of the Ru capping layer 108 (e.g., during exposure tool use, etc.). The Ru oxide layer 110 becomes an absorber of EUV light and diminishes the reflectivity of the Bragg reflector 112. Reduction of the Ru oxide layer 110 will restore the reflectivity performance and also enhance the lifespan of the EUV photomask 114.

Figure 2:
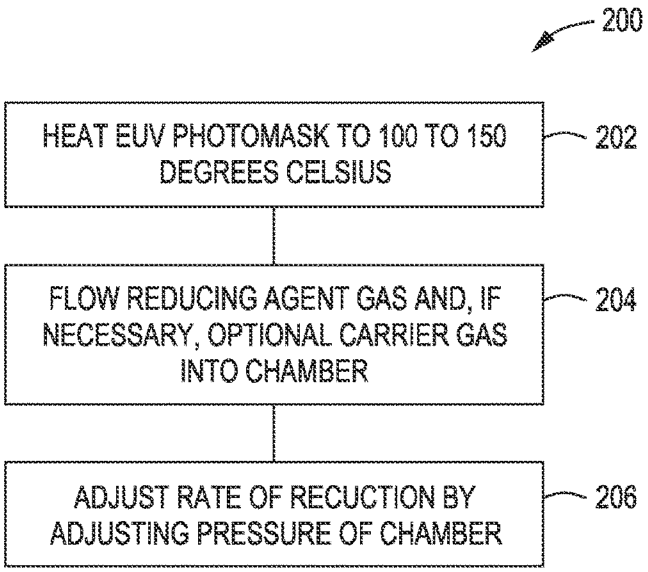
FIG. 2 is a method of reduction of Ru oxide in accordance with some embodiments of the present principles.
Figure 3:
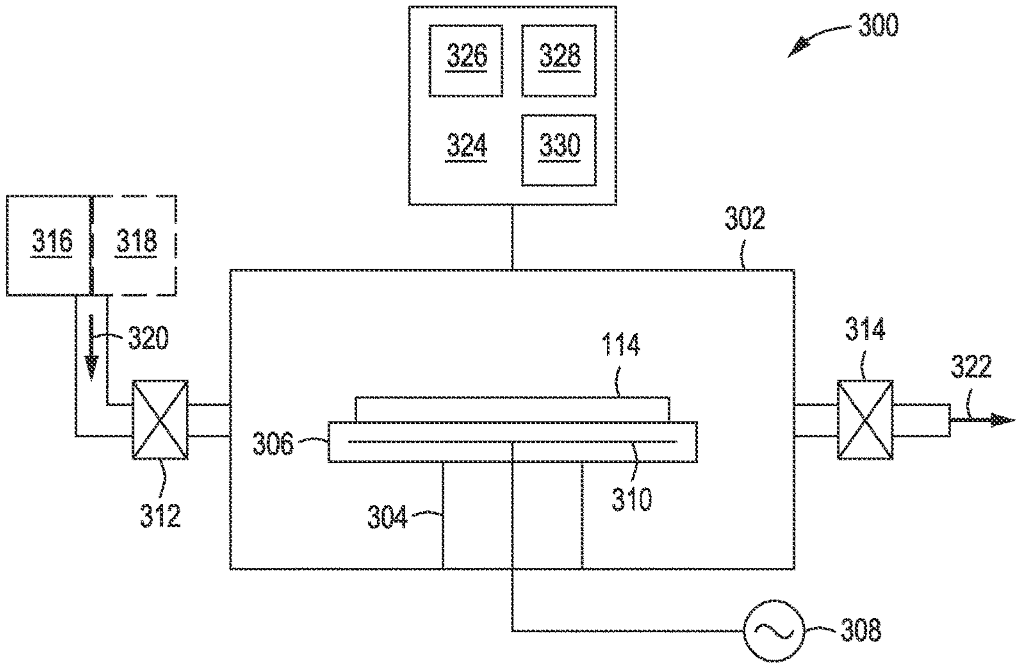
FIG. 3 depicts a cross-sectional view of a photomask processing chamber in accordance with some embodiments of the present principles.

In FIG. 2, a method 200 of Ru oxide reduction is described using the apparatus in the cross-sectional view 300 of FIG. 3. In block 202, the EUV photomask 114 is heated to a temperature of approximately 100 degrees Celsius to approximately 150 degrees Celsius. The upper end of the temperature range is limited by the thermal budget of the EUV photomask 114. If the thermal budget of the EUV photomask 114 is higher than 150 degrees Celsius, the temperature range can be extended to the higher thermal budget. The higher the temperature, the more kinetic energy provided, the higher the Ru oxide reduction rate, enabling higher throughput (faster processing times). The lower end of the temperature range is controlled by the minimum temperature needed to provide the minimum kinetic energy to start and sustain the reduction reaction. The inventors have found that approximately 100 degrees Celsius is enough to provide the kinetic energy for activation of the Ru oxide reduction. In some embodiments, the EUV photomask 114 may be heated by a heater electrode 310 embedded in a photomask support body 306 of a photomask support 304 in a photomask processing chamber 302. The heater electrode 310 may be electrically heated by an AC power source 308.

In block 204, a reducing agent gas 316 (oxide reducing agent) and, if necessary, an optional carrier gas 318 are flowed 320 together into the photomask processing chamber 302 and across the EUV photomask 114. The effluent gas flows 322 out of the photomask processing chamber 302 opposite of the gases entering the photomask processing chamber 302. The optional carrier gas 318 may be an inert gas such as, but not limited to, argon, helium, or nitrogen and the like. In some embodiments, the inventors have found that the reducing agent gas 316 may be carbon monoxide (CO), methane ($CH_4$), or hydrogen ($H_2$) gas. The optional carrier gas 318 is not necessary for CO and $CH_4$, but must be used when $H_2$ is used in order to prevent the possible explosion of high concentration $H_2$. In some embodiments, other reducing agents may be used. The reducing agent gas 316 reduces the Ru oxide and tetroxide from the top surface of the Ru capping layer 108 to Ru metal. The CO gas reacts with Ru oxide when the oxide is heated to temperatures where the oxygen atoms combine with the carbon monoxide gas to produce carbon dioxide, reducing the Ru oxide to Ru metal. The $CH_4$ gas reacts with the Ru oxide to produce a carbon dioxide gas with the heated Ru oxide acting as an oxygen donor, reducing the Ru oxide to Ru metal. The $H_2$ gas reacts with the Ru oxide to produce water ($H_2O$) with the heated Ru oxide acting as an oxygen donor, reducing the Ru oxide to Ru metal.

In block 206, the rate of reduction is adjusted by adjusting the pressure of the photomask processing chamber 302. The pressure is controlled by adjusting a first valve 312 which adjusts the gas inlet flow and by adjusting a second valve 314 which adjusts the gas outlet flow. Higher inlet flow rates and lower outlet flow rates cause pressure to rise within the photomask processing chamber 302, and the pressure can be adjusted accordingly. In some embodiments, the pressure is adjusted from zero to approximately 150 psi. The higher limit is based on using the photomask processing chamber 302 safely and can be adjusted higher for further increased reduction rates with appropriate chamber design. In some embodiments, the pressure may be adjusted from zero to approximately 1500 psi. In some embodiments, the pressure may be adjusted from zero to 2500 psi if a cylindrical type pressure chamber is used for the photomask processing chamber 302.

A controller 324 controls the operation of the photomask processing chamber 302 using a direct control or alternatively, by controlling the computers (or controllers) associated with the photomask processing chamber 302. In operation, the controller 324 enables data collection and feedback from the systems to optimize performance of the photomask processing chamber 302. For example, the controller 324 may control the heating of the EUV photomask, the concentration and flow rate of the reducing agent gas and the optional carrier gas, the valving to control and adjust the pressure within the photomask processing chamber 302, and the like. The controller 324 generally includes a Central Processing Unit (CPU) 326, a memory 328, and a support circuit 330. The CPU 326 may be any form of a general-purpose computer processor that can be used in an industrial setting. The support circuit 330 is conventionally coupled to the CPU 326 and may comprise a cache, clock circuits, input/output subsystems, power supplies, and the like. Software routines, such as a method as described above may be stored in the memory 328 and, when executed by the CPU 326, transform the CPU 326 into a specific purpose computer (controller 324). The software routines may also be stored and/or executed by a second controller (not shown) that is located remotely from the photomask processing chamber 302.

The memory 328 is in the form of computer-readable storage media that contains instructions, when executed by the CPU 326, to facilitate the operation of the semiconductor processes and equipment. The instructions in the memory 328 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 4:
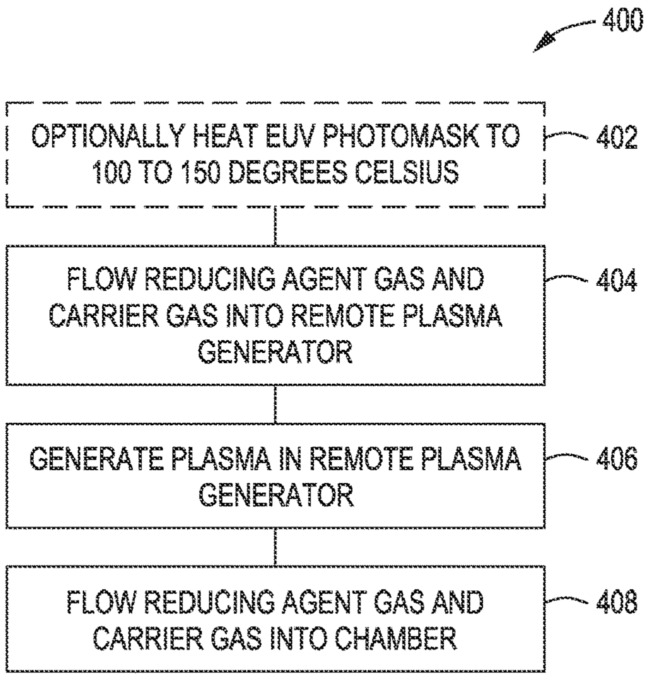
FIG. 4 is a method of reduction of Ru oxide in accordance with some embodiments of the present principles.
Figure 5:
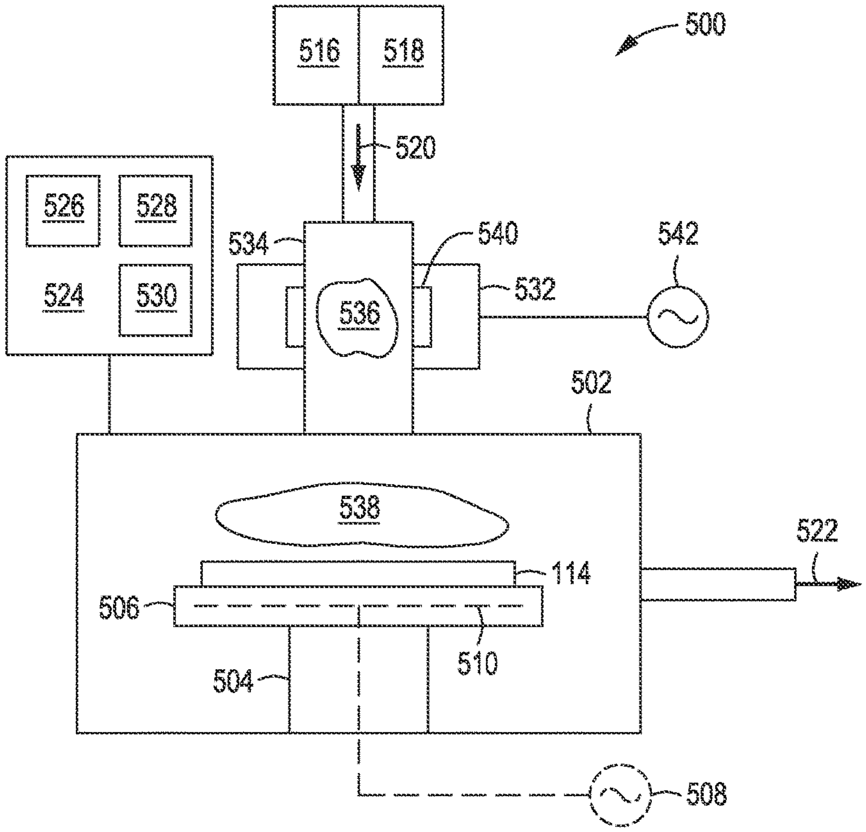
FIG. 5 depicts a cross-sectional view of a photomask processing chamber in accordance with some embodiments of the present principles.

In FIG. 4, a method 400 of Ru oxide reduction is described using the apparatus in the cross-sectional view 500 of FIG. 5. In block 402, the EUV photomask 114 is optionally heated to a temperature of approximately 100 degrees Celsius to approximately 150 degrees Celsius. The upper end of the temperature range is limited by the thermal budget of the EUV photomask 114. If the thermal budget of the EUV photomask 114 is higher than 150 degrees Celsius, the temperature range can be extended to the higher thermal budget. The higher the temperature, the more kinetic energy provided, the higher the Ru oxide reduction rate, enabling higher throughput. The lower end of the temperature range is controlled by the minimum temperature needed to provide the minimum kinetic energy to start and sustain the reduction reaction. The inventors have found that approximately 100 degrees Celsius is enough to provide the kinetic energy for activating the Ru oxide reduction. In some embodiments, the EUV photomask 114 may be heated by an optional heater electrode 510 embedded in a photomask support body 506 of a photomask support 504 in a photomask processing chamber 502. The optional heater electrode 510 may be electrically heated by an AC power source 508. Whether or not to use the optional heater electrode 510 depends on the Ru oxide reducing rate. When the reducing rate is high enough when enhanced by plasma power, the optional heater electrode 510 is not necessary.

In block 404, a reducing agent gas 516 and a carrier gas 518 are flowed 520 together into a remote plasma generator 532. In block 406, plasma is generated by the remote plasma generator 532. The remote plasma generator 532 has one or more coils 540 to produce inductively coupled plasma or toroidal plasma in the remote plasma generator 532 in the plasma pipe 534. The plasma power source 542 supplies RF power to the remote plasma generator 532 to generate the plasma 536. In some embodiments, the RF power operates at a frequency of 13.56 MHz. Higher RF power provides more energy within the plasma 536 which subsequently provides more energy into the oxide reduction that occurs within the photomask processing chamber 502. If the RF power is too high, heat generated may exceed the thermal budget of the EUV photomask 114 and/or cause arcing damage to the EUV photomask 114.

In block 408, the reducing agent gas and carrier gas flow into the photomask processing chamber to react with the Ru oxide and reduce the Ru oxide to Ru metal. The reducing agent gas 516 may become dissociated within the plasma 536 and produce ions or neutrals that flow with the reducing agent gas 516 and the carrier gas 518 through the plasma pipe 534 and into the photomask processing chamber 502. A remote plasma 538 is present within the photomask processing chamber 502 but is typically much weaker than the plasma 536 generated in the remote plasma generator 532. The remote plasma 538 induces a self-bias on the EUV photomask 114 to aid in reduction of the Ru oxide to Ru metal. The self-bias of the EUV photomask 114 causes bombardment by the ions and/or neutrals on the top surface of the Ru oxide of the EUV photomask 114. The bombardment may be weak, but the bombardment is sufficient to enhance the reduction of the Ru oxide to aid in increasing the reduction rate, gradually removing the layer of Ru oxide. The photomask processing chamber 502 is held at a vacuum during the processing. The effluent gas then flows 522 out of the photomask processing chamber 502.

The carrier gas 518 may be an inert gas such as, but not limited to, argon, helium, or nitrogen and the like. In some embodiments, the inventors have found that the reducing agent gas 516 may be carbon monoxide (CO), methane ($CH_4$), or hydrogen ($H_2$) gas. In some embodiments, other reducing agents may be used. The CO gas reacts with Ru oxide when the oxide is heated to temperatures where the oxygen atoms combine with the carbon monoxide gas to produce carbon dioxide, reducing the Ru oxide to Ru metal. The $CH_4$ gas reacts with the Ru oxide to produce a carbon dioxide gas with the heated Ru oxide acting as an oxygen donor, reducing the Ru oxide to Ru metal. The $H_2$ gas reacts with the Ru oxide to produce water ($H_2O$) with the heated Ru oxide acting as an oxygen donor, reducing the Ru oxide to Ru metal. The inventors have found that when the reducing agent gas is $H_2$, the $H_2$ will be dissociated into atomic hydrogen (H) by the plasma 536. The atomic hydrogen will then bombard the EUV photomask 114 and may implant H into the Ru capping layer under certain conditions, causing damage. Atomic hydrogen is also known for causing delamination and may cause the Ru capping layer to peel off. The inventors have found that using hydrogen gas requires careful control of the processing environment. In some embodiments, the self-bias power achieved using remote plasma is generally approximately 10 electron volts (eV) to approximately 20 eV. If the plasma is adjusted so that the self-bias power can be controlled to less than 5 eV, atomic hydrogen implantation may be prevented. However, the inventors have found that with a self-bias power of 5 eV or less, the plasma becomes unstable and is not sustainable. Tight controls and monitoring to achieve near but above 5 eV may provide a sustainable plasma without causing hydrogen implanting into the Ru capping layer, allowing the use of hydrogen under some conditions.

A controller 524 controls the operation of the photomask processing chamber 502 using a direct control or alternatively, by controlling the computers (or controllers) associated with the photomask processing chamber 502. In operation, the controller 524 enables data collection and feedback from the systems to optimize performance of the photomask processing chamber 502. For example, the controller 524 may control the heating of the EUV photomask, the concentration and flow rate of the reducing agent gas and the carrier gas, the plasma power and subsequent self-bias power, and the like. The controller 524 generally includes a Central Processing Unit (CPU) 526, a memory 528, and a support circuit 530. The CPU 526 may be any form of a general-purpose computer processor that can be used in an industrial setting. The support circuit 530 is conventionally coupled to the CPU 526 and may comprise a cache, clock circuits, input/output subsystems, power supplies, and the like. Software routines, such as a method as described above may be stored in the memory 528 and, when executed by the CPU 526, transform the CPU 526 into a specific purpose computer (controller 524). The software routines may also be stored and/or executed by a second controller (not shown) that is located remotely from the photomask processing chamber 502.

The memory 528 is in the form of computer-readable storage media that contains instructions, when executed by the CPU 526, to facilitate the operation of the semiconductor processes and equipment. The instructions in the memory 528 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 6:
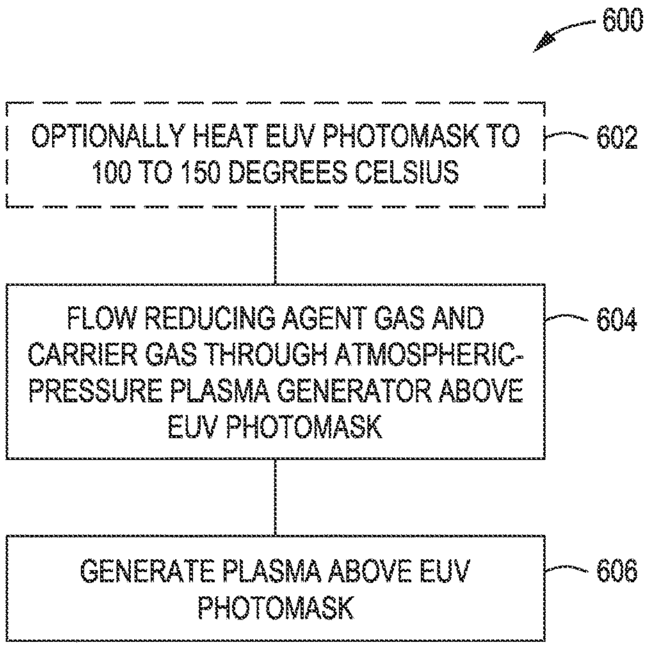
FIG. 6 is a method of reduction of Ru oxide in accordance with some embodiments of the present principles.
Figure 7:
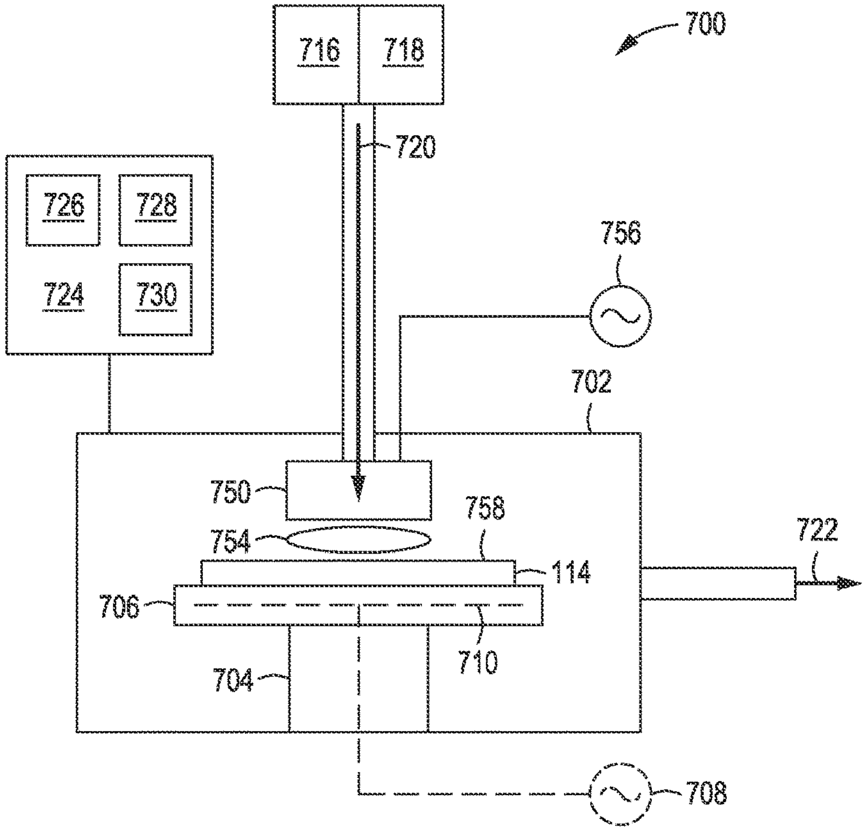
FIG. 7 depicts a cross-sectional view of a photomask processing chamber in accordance with some embodiments of the present principles.

In FIG. 6, a method 600 of Ru oxide reduction is described using the apparatus in the cross-sectional view 700 of FIG. 7 in a non-vacuum environment. In block 602, the EUV photomask 114 is optionally heated to a temperature of approximately 100 degrees Celsius to approximately 150 degrees Celsius. The upper end of the temperature range is limited by the thermal budget of the EUV photomask 114. If the thermal budget of the EUV photomask 114 is higher than 150 degrees Celsius, the temperature range can be extended to the higher thermal budget. The higher the temperature, the more kinetic energy provided, the higher the Ru oxide reduction rate, enabling higher throughput. The lower end of the temperature range is controlled by the minimum temperature needed to provide the minimum kinetic energy to start and sustain the reduction reaction. The inventors have found that approximately 100 degrees Celsius is high enough to provide the kinetic energy for Ru oxide reduction. In some embodiments, the EUV photomask 114 may be heated by a heater electrode 710 embedded in a photomask support body 706 of a photomask support 704 in a photomask processing chamber 702. The heater electrode 710 may be electrically heated by an AC power source 708. Whether or not to use the optional heater electrode 710 depends on the Ru oxide reducing rate. When the reducing rate is high enough when enhanced by plasma power, the optional heater electrode 710 is not necessary.

In block 604, a reducing agent gas 716, and a carrier gas 718 are flowed 720 together into the photomask processing chamber 702 through an atmospheric-pressure (AP) plasma generator 750 that is in close proximity to the top surface 758 of the EUV photomask. In block 606, dielectric barrier discharge (DBD) plasma 754 is generated by the AP plasma generator 750 to reduce the Ru oxide to Ru metal. The plasma power source 756 supplies RF power to the AP plasma generator 750 to generate the DBD plasma 754. In some embodiments, the RF power operates at a frequency of 13.56 MHz. Higher RF power provides more energy within the DBD plasma 754 which can provide more energy into the Ru oxide. If the RF power is too high, heat generated may exceed the thermal budget of the EUV photomask 114 and/or cause arcing damage to the EUV photomask 114 due to the close proximity of the AP plasma generator 750 to the top surface 758 of the EUV photomask 114. The effluent gas then flows 722 out of the photomask processing chamber 702. The carrier gas 718 may be an inert gas such as, but not limited to, argon, helium, or nitrogen and the like. In some embodiments, the inventors have found that the reducing agent gas 716 may be carbon monoxide (CO), methane ($CH_4$), or hydrogen ($H_2$) gas. In some embodiments, other reducing agents may be used. The CO gas reacts with Ru oxide when the oxide is heated to temperatures where the oxygen atoms combine with the carbon monoxide gas to produce carbon dioxide, reducing the Ru oxide to Ru metal. The $CH_4$ gas reacts with the Ru oxide to produce a carbon dioxide gas with the heated Ru oxide acting as an oxygen donor, reducing the Ru oxide to Ru metal. The $H_2$ gas reacts with the Ru oxide to produce water ($H_2O$) with the heated Ru oxide acting as an oxygen donor, reducing the Ru oxide to Ru metal. AP plasma gas has a much smaller mean free path than remote vacuum plasma, so bombardment is low without $H_2$ implantation, but the bombardment energy is high enough to enhance Ru oxide reduction by reducing agents.

A controller 724 controls the operation of the photomask processing chamber 702 using a direct control or alternatively, by controlling the computers (or controllers) associated with the photomask processing chamber 702. In operation, the controller 724 enables data collection and feedback from the systems to optimize performance of the photomask processing chamber 702. For example, the controller 324 may control the heating of the EUV photomask, the concentration and flow rate of the reducing agent gas and the carrier gas, the RF power supplied to form plasma, and the like. The controller 724 generally includes a Central Processing Unit (CPU) 726, a memory 728, and a support circuit 730. The CPU 726 may be any form of a general-purpose computer processor that can be used in an industrial setting. The support circuit 730 is conventionally coupled to the CPU 726 and may comprise a cache, clock circuits, input/output subsystems, power supplies, and the like. Software routines, such as a method as described above may be stored in the memory 728 and, when executed by the CPU 726, transform the CPU 726 into a specific purpose computer (controller 724). The software routines may also be stored and/or executed by a second controller (not shown) that is located remotely from the photomask processing chamber 702.

The memory 728 is in the form of computer-readable storage media that contains instructions, when executed by the CPU 726, to facilitate the operation of the semiconductor processes and equipment. The instructions in the memory 728 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for reducing ruthenium oxides on an extreme ultraviolet (EUV) photomask, comprising:

heating the EUV photomask with a ruthenium (Ru) capping layer with a top surface which has a Ru oxide layer to a temperature of approximately 100 degrees Celsius to approximately a thermal budget of the EUV photomask;

flowing a reducing agent gas into an EUV photomask processing chamber; and pressurizing the EUV photomask processing chamber to a process pressure to increase a reducing reaction between the reducing agent gas and the Ru oxide layer on the Ru capping layer.

2. The method of claim 1, wherein the process pressure is from zero to approximately 150 psi.

3. The method of claim 1, wherein the process pressure is from zero to approximately 1500 psi.

4. The method of claim 1, wherein the EUV photomask processing chamber is a cylindrical chamber and the process pressure is from zero to approximately 2500 psi.

5. The method of claim 1, wherein the process pressure is obtained by regulating a flow of the reducing agent gas into the EUV photomask processing chamber and effluent gases out of the EUV photomask processing chamber.

6. The method of claim 1, wherein the reducing agent gas is carbon monoxide gas, methane gas, or hydrogen gas.

7. The method of claim 1, further comprising:

flowing a carrier gas along with the reducing agent gas, wherein the carrier gas reduces volatility of high concentrations of explosive reducing agent gases.

8. The method of claim 1, wherein the thermal budget of the EUV photomask is approximately 150 degrees Celsius.

9. A method for reducing ruthenium oxides on an extreme ultraviolet (EUV) photomask, comprising:

flowing a reducing agent gas and a carrier gas into a remote plasma generator;

heating the EUV photomask to a temperature of approximately 100 degrees Celsius to approximately a thermal budget of the EUV photomask;

generating a plasma in the remote plasma generator using an RF power source; and flowing gases from the remote plasma generator into an EUV photomask processing chamber, wherein a remote plasma is formed above the EUV photomask to generate a self-bias on the EUV photomask and wherein the gases in the EUV photomask processing chamber react with a ruthenium (Ru) oxide layer on a Ru capping layer to reduce the Ru oxide layer to Ru metal.

10. The method of claim 9, wherein EUV photomask processing chamber operates in a vacuum.

11. The method of claim 9, wherein the plasma in the remote plasma generator is inductively coupled plasma.

12. The method of claim 9, wherein the reducing agent gas is carbon monoxide gas or methane gas and the carrier gas is argon gas, helium gas, or nitrogen gas.

13. The method of claim 9, wherein the RF power source operates at a frequency of 13.56 MHz.

14. The method of claim 9, wherein the reducing agent gas is hydrogen gas and the remote plasma is adjusted to a sustainable level while providing a self-biasing power level of approximately 5 eV such that implantation of atomic hydrogen into the Ru capping layer is prevented.

15. The method of claim 9, wherein the thermal budget of the EUV photomask is approximately 150 degrees Celsius.

16. A method for reducing ruthenium oxides on an extreme ultraviolet (EUV) photomask, comprising:

flowing a reducing agent gas and a carrier gas into an atmospheric-pressure (AP) plasma generator in an EUV photomask processing chamber;

heating the EUV photomask to a temperature of approximately 100 degrees Celsius to approximately a thermal budget of the EUV photomask;

generating a plasma above the EUV photomask with the AP plasma generator using an RF power source; and flowing the reducing agent gas and the carrier gas into the plasma and onto a top surface of the EUV photomask, wherein the reducing agent gas reacts with a ruthenium (Ru) oxide layer on a Ru capping layer to reduce the Ru oxide layer to Ru metal.

17. The method of claim 16, wherein the thermal budget of the EUV photomask is approximately 150 degrees Celsius.

18. The method of claim 16, wherein the plasma in the AP plasma generator is dielectric barrier discharge plasma.

19. The method of claim 16, wherein the reducing agent gas is carbon monoxide gas, methane gas, or hydrogen gas and the carrier gas is argon gas, helium gas, or nitrogen gas.

20. The method of claim 16, wherein the RF power source operates at a frequency of 13.56 MHz.

21. An apparatus for reducing ruthenium (RU Ru) oxides on an extreme ultraviolet (EUV) photomask, comprising:

an EUV photomask processing chamber with a photomask support body attached to a photomask support, the photomask support body supporting an EUV photomask when present;

a reducing agent gas supply fluidly connected to the EUV photomask processing chamber;

a heater electrode in the photomask support body that is configured to heat the EUV photomask when present to a range of approximately 100 degrees to approximately 150 degrees;

a first valve that controls a reducing agent gas that enters into the EUV photomask processing chamber;

a second valve that controls effluent gases that exit the EUV photomask processing chamber; and a controller that regulates the first valve and the second valve to adjust a pressure inside of the EUV photomask processing chamber, wherein the pressure is adjustable from zero psi to 2500 psi and is adjusted, by the controller, to control a reduction rate to reduce Ru oxides on a Ru capping layer on the EUV photomask.

22. An apparatus for reducing ruthenium (Ru) oxides on an extreme ultraviolet (EUV) photomask, comprising:

an EUV photomask processing chamber with a photomask support body attached to a photomask support, the photomask support body supporting an EUV photomask when present;

a heater electrode in the photomask support body that is configured to heat the EUV photomask when present to a range of approximately 100 degrees to approximately 150 degrees to enhance a reduction rate of Ru oxides;

a reducing agent gas supply fluidly connected to the EUV photomask processing chamber;

a carrier gas supply fluidly connected to the EUV photomask processing chamber; and a remote plasma generator fluidly connected to the EUV photomask processing chamber, wherein the remote plasma generator is configured to form a remote plasma above the EUV photomask to generate a self-bias on the EUV photomask and is configured to allow a reducing agent gas from the reducing agent gas supply and a carrier gas from the carrier gas supply flow through the remote plasma generator when plasma is generated in the remote plasma generator and subsequently allow the reducing agent gas, the carrier gas, and the plasma to flow into the EUV photomask processing chamber to interact with the EUV photomask when present to reduce Ru oxides on a Ru capping layer on the EUV photomask.

23. The apparatus of claim 22, further comprising:

a controller that regulates a reduction rate of the Ru oxides by regulating a power applied to the plasma in the remote plasma generator or by regulating a temperature of the EUV photomask when present by adjusting power to the heater electrode.

24. An apparatus for reducing ruthenium (Ru) oxides on an extreme ultraviolet (EUV) photomask, comprising:

an EUV photomask processing chamber with a photomask support body attached to a photomask support, the photomask support body supporting an EUV photomask when present;

a heater electrode in the photomask support body that is configured to heat the EUV photomask when present to a range of approximately 100 degrees to approximately 150 degrees to enhance a reduction rate of Ru oxides;

a reducing agent gas supply fluidly connected to the EUV photomask processing chamber;

a carrier gas supply fluidly connected to the EUV photomask processing chamber; and an atmospheric-pressure (AP) plasma generator in the EUV photomask processing chamber, wherein the AP plasma generator is configured to allow a reducing agent gas from the reducing agent gas supply and a carrier gas from the carrier gas supply to flow through the AP plasma generator when dielectric barrier discharge plasma is generated by the AP plasma generator directly above the EUV photomask and subsequently allow the reducing agent gas and the carrier gas to flow onto a top surface of the EUV photomask to reduce Ru oxides on a Ru capping layer on the EUV photomask.

25. The apparatus of claim 24, further comprising:

a controller that regulates a reduction rate of the Ru oxides by adjusting a power applied to the dielectric barrier discharge plasma in the AP plasma generator or by adjusting a temperature of the EUV photomask when present by adjusting power to the heater electrode.

* * * * *